(12) United States Patent
Islam et al.

(10) Patent No.: US 11,555,719 B2
(45) Date of Patent: Jan. 17, 2023

(54) ACTUATOR ASSEMBLY HAVING ROTARY SENSOR RESPONSIVE TO ROTATION OF MAGNET

(71) Applicant: MANDO CORPORATION, Gyeonggi-do (KR)

(72) Inventors: Mohammad Islam, Bay City, MI (US); Christian Ross, Bay City, MI (US); Mazharul Chowdhury, Bay City, MI (US)

(73) Assignee: HL MANDO CORPORATION, Gyeonggi-Do (KR)

( * ) Notice: Subject to any disclaimer, the term of this patent is extended or adjusted under 35 U.S.C. 154(b) by 250 days.

(21) Appl. No.: 16/709,803

(22) Filed: Dec. 10, 2019

(65) Prior Publication Data
US 2020/0191616 A1   Jun. 18, 2020

Related U.S. Application Data

(60) Provisional application No. 62/778,838, filed on Dec. 12, 2018.

(51) Int. Cl.
| | |
|---|---|
| G01D 11/24 | (2006.01) |
| G01D 5/14 | (2006.01) |
| G01R 33/07 | (2006.01) |
| H02K 11/215 | (2016.01) |
| H01F 7/06 | (2006.01) |

(52) U.S. Cl.
CPC ........... *G01D 11/245* (2013.01); *G01D 5/145* (2013.01); *G01R 33/072* (2013.01); *H01F 7/064* (2013.01); *H02K 11/215* (2016.01)

(58) Field of Classification Search
CPC ...... H02K 29/08; H02K 11/215; H02K 11/21; G01D 5/145; G01D 11/245; G01R 33/0076; G01R 33/072; H01F 7/064
See application file for complete search history.

(56) References Cited

U.S. PATENT DOCUMENTS

| | | | |
|---|---|---|---|
| 10,615,670 B2 * | 4/2020 | Madineni | H02K 11/215 |
| 2014/0035506 A1 * | 2/2014 | Ludwig | E05F 15/603 |
| | | | 318/490 |

(Continued)

OTHER PUBLICATIONS

AMS: Operation Manual: RMH05-DK-XX-1.0: Rotary Magnet Holder for Adapterboards, Jul. 12, 2012, pp. 1-3.

*Primary Examiner* — Giovanni Astacio-Oquendo
(74) *Attorney, Agent, or Firm* — Ladas & Parry, LLP (57) ABSTRACT

An actuator assembly comprises: a rotatable shaft, a magnet mounted to the rotatable shaft, non-magnet material positioned between the magnet and the shaft, a rotary sensor configured to be responsive to rotation of the magnet for generating a signal, and a housing comprising a magnetic shield surrounding at least a part of the rotary sensor and at least a part of the magnet mounted to the shaft to shield the sensor and the magnet from an external magnetic field. The actuator assembly further comprises a magnet holder fixing the magnet to the shaft. The magnetic shield encompasses the magnetic flux from the magnet to the rotary sensor and also shields the rotary sensor from any external magnetic field such as stray field or magnetic field from the outside of the housing. The non-magnetic material may reduce leakage magnetic flux from the magnet to the shaft.

14 Claims, 7 Drawing Sheets

(56) References Cited

U.S. PATENT DOCUMENTS

| | | | |
|---|---|---|---|
| 2016/0033305 A1* | 2/2016 | Mehnert | G01D 5/145 |
| | | | 324/207.18 |
| 2016/0245674 A1 | 8/2016 | Ausserlechner | |
| 2016/0265940 A1 | 9/2016 | Burgdorf et al. | |
| 2018/0010927 A1* | 1/2018 | Forthaus | G01D 5/145 |
| 2018/0202836 A1* | 7/2018 | Gorai | G01D 5/16 |
| 2018/0216712 A1* | 8/2018 | Forrester, Jr. | F16H 37/041 |
| 2018/0248451 A1 | 8/2018 | Hagiwara | |
| 2018/0266530 A1* | 9/2018 | Alfano | H01R 13/5202 |

\* cited by examiner

ACTUATOR ASSEMBLY HAVING ROTARY SENSOR RESPONSIVE TO ROTATION OF MAGNET

CROSS REFERENCE TO RELATED APPLICATION(S)

This application claims the benefit of U.S. Patent Application Ser. No. 62/778,838, filed on Dec. 12, 2018, entitled "NON-CONTACT STRAY FIELD IMMUNE ROTARY POSITION", which is all hereby incorporated herein by reference in its entirety.

BACKGROUND

Various embodiments of the present disclosure relate in general to the field of sensors, and more particularly, to an apparatus for precisely measuring angular displacement of a shaft associated with a magnet.

Precise and accurate measurements of angular positions of a shaft directly or indirectly coupled to an actuator are necessary in many control and monitoring applications including vehicle, aircraft, military, transportation, energy, automation and industrial. The position of the shaft is determined via the use of a rotary position sensor. Such sensors may include encoders, Hall effect position sensors, potentiometers, resolvers and rotary variable differential transformers (RVDTs). For example, Hall effect sensor senses and measures changes in the magnitude and/or direction of the magnetic field generated by a magnet have been used for sensing the position of the shaft of the sensor.

It is with respect to these and other general considerations that the following embodiments have been described. Also, although relatively specific problems have been discussed, it should be understood that the embodiments should not be limited to solving the specific problems identified in the background.

SUMMARY

The features and advantages of the present disclosure will be more readily understood and apparent from the following detailed description, which should be read in conjunction with the accompanying drawings, and from the claims which are appended to the end of the detailed description.

According to some embodiments of the present disclosure, an actuator assembly may comprise: a rotatable shaft; a magnet mounted to the rotatable shaft; non-magnetic material positioned between the magnet and the shaft; a rotary sensor configured to be responsive to rotation of the magnet for generating a signal; and a housing comprising a magnetic shield surrounding at least a part of the rotary sensor and at least a part of the magnet mounted to the shaft to shield the sensor and the magnet from an external magnetic field. The magnetic shield may act to encompass the magnetic flux from the magnet to the rotary sensor and also to shield the rotary sensor from any external magnetic field such as stray field or magnetic field from the outside of the housing. The non-magnetic material may reduce leakage magnetic flux from the magnet to the shaft. The rotatable shaft is directly or indirectly coupled to an actuator such as a motor.

The actuator assembly may further comprise a magnet holder fixing the magnet to the rotatable shaft. The magnet holder may be made of non-magnetic material. The magnet holder may comprise: a space in which the magnet is disposed; and an opening into which the shaft is inserted.

The magnetic shield may be made of soft magnetic material. The magnetic shield may be embedded in the housing. Alternatively, the magnetic shield can be included in or coupled to any stationary part of the actuator assembly instead of the housing. The magnetic shield may surround lateral sides of the sensor and the magnet. The magnetic shield has a cylindrical shape in which the sensor and the magnet are disposed. For example, the magnetic shield comprises steel having a hollow cylinder shape.

The magnet may have a shape so that magnetization of the magnet is u-shaped. The magnet may have a depression formed on a surface of the magnet facing the sensor. The depression of the magnet may reduce the error in the sensing operation or measurement from the rotary sensor by generating the U-shaped magnetization to provide uniform magnetic field to the rotary sensor.

The non-magnetic material positioned between the magnet and the shaft may be potting material or plastic. The non-magnetic material of the magnet holder may be brass or aluminum.

The actuator assembly may further comprise a circuit board positioned between the sensor and an inner surface of the housing.

The shaft may comprise a first shaft portion which having a diameter less than a diameter of an inner surface of the housing and a second shaft portion which has a diameter greater than a diameter of the inner surface of the housing.

This Summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Various embodiments in accordance with the present disclosure will be described with reference to the drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF EMBODIMENTS

In the following detailed description, reference is made to the accompanying drawings which form a part of the present disclosure, and in which are shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the invention. The following detailed description is therefore not to be taken in a limiting sense, and the scope of the invention is defined only by the appended claims and equivalents thereof. Like numbers in the figures refer to like components, which should be apparent from the context of use.

Referring now to FIGS. 1 to 4, an actuator assembly 100 is illustrated. The actuator assembly 100 generally includes an actuator shaft assembly 110 and a probe housing assembly 130.

The actuator shaft assembly 110 comprises a rotatable shaft 112 and a magnet 122.

The rotatable shaft 112 may be directly or indirectly coupled to an actuator such as a motor. For example, the rotatable shaft 112 may be attached to the motor or other rotatable object, or be part of the motor. The rotatable shaft 112 rotates about an axis of rotation with a rotation direction, which can be clockwise or counter clockwise. For example, the rotatable shaft 112 is generally a long cylindrical rod comprised of a suitable material, such as a metal, soft magnetic material, and the like.

The magnet 122 is mounted to the rotatable shaft 112. For example, the magnet 122 is fixed to a distal end of the rotatable shaft 112 facing a rotary sensor 134. The magnet 122 generates a magnetic field and configured for measurement. The magnet 122 rotates together with the rotatable shaft 112. The magnet 122 may be, for example, but not limited to, a puck magnet or a ring magnet.

Figure 5A:
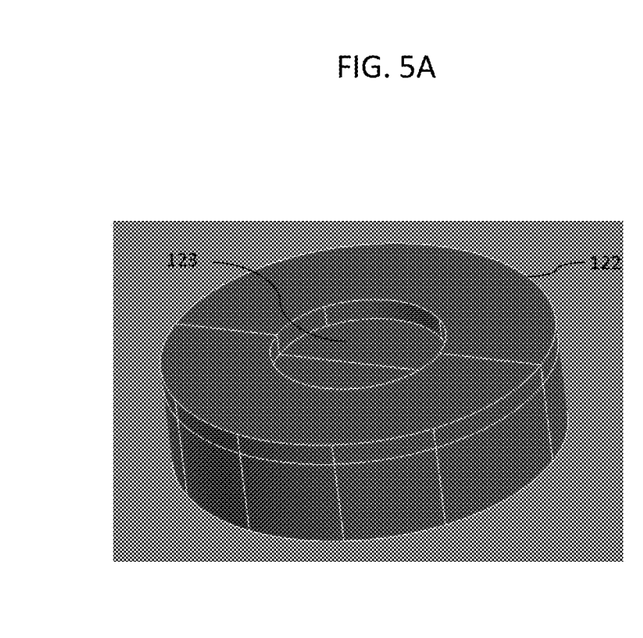
FIG. 5A shows a perspective view of a magnet according to an embodiment of the present disclosure.
Figure 5B:
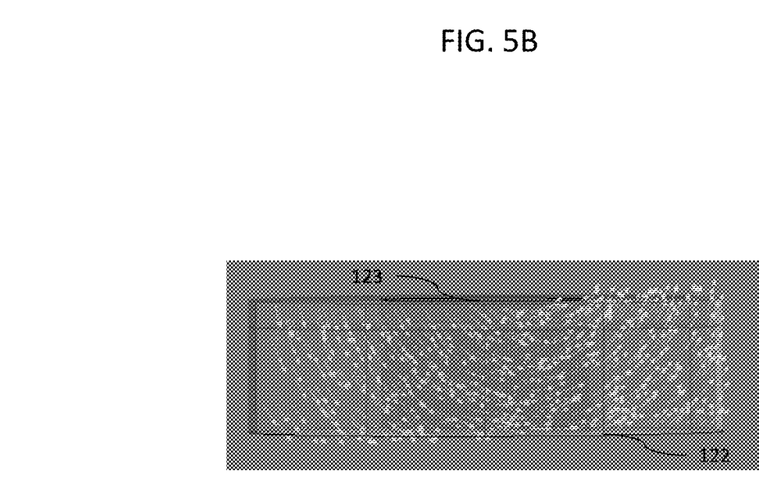
FIG. 5B shows magnetization generated by a magnet according to an embodiment of the present disclosure.

As shown in FIG. 5A, the magnet 122 may have a depression 123, which is a non-magnetic region. The depression 123 is formed on a surface of the magnet facing the rotary sensor 134. By having the depression 123 on the surface of the magnet 122, the magnetization of the magnet 122 can be made to be U-shaped in order to provide uniform magnetic field to the rotary sensor 134 as illustrated in FIG. 5B. However, the present disclosure is not limited to any particular shape of the magnet or the U-shaped magnetization. The magnet 122 can have any appropriate shape and generate any necessary pattern or shape of magnetic field. Further, the depression 123 of the magnet 122 may reduce the error in the sensing operation or measurement from the rotary sensor 134.

Figure 6:
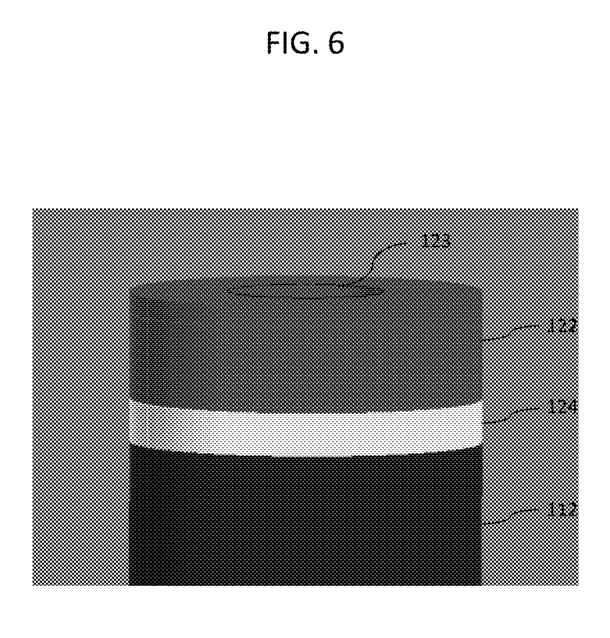
FIG. 6 shows a perspective view of an actuator shaft assembly according to an embodiment of the present disclosure.

Non-magnetic material 124 may be disposed between the rotatable shaft 112 and the magnet 122 as shown in FIG. 6. The non-magnetic material 124 may reduce leakage magnetic flux from the magnet 122 to the rotatable shaft 112. The non-magnetic material 124 may include, for example, but not limited to, potting material, plastic, a synthetic resin material, aluminum, copper, stainless steel, brass, and the like.

A magnet assembly 120 comprises a magnet holder 126. The magnet holder 126 may have a space 127 for holding the magnet 122. The magnet 122 is positioned within the space 127 of the magnet holder 126 such that the magnet 122 produces magnetic flux which flows from the magnet 122 to the rotary sensor 134. For example, the magnet holder 126 may at least substantially surround the magnet 122. The magnet holder 126 is made of, for example, but not limited to, non-magnetic material such as brass, aluminum, potting material, plastic, a synthetic resin material, stainless steel, copper, and the like. The magnet holder 126 includes a fixing structure or means 129 configured to fixing the magnet 122 to the rotatable shaft 112. For instance, the fixing structure or means 129 of the magnet holder 126 has an opening which is inserted into the distal end of the rotatable shaft 112 and a wall that contacts the rotatable shaft 112 and holds the magnet holder 126 and the rotatable shaft 112 together. In the magnet holder 126, the non-magnetic material 124 may be disposed between the rotatable shaft 112 and the magnet 122. In another example, the non-magnetic material 124 may be part of the magnet holder 126. Alternatively, the magnet holder 126 may have an air gap between the rotatable shaft 112 and the magnet 122.

Figure 1:
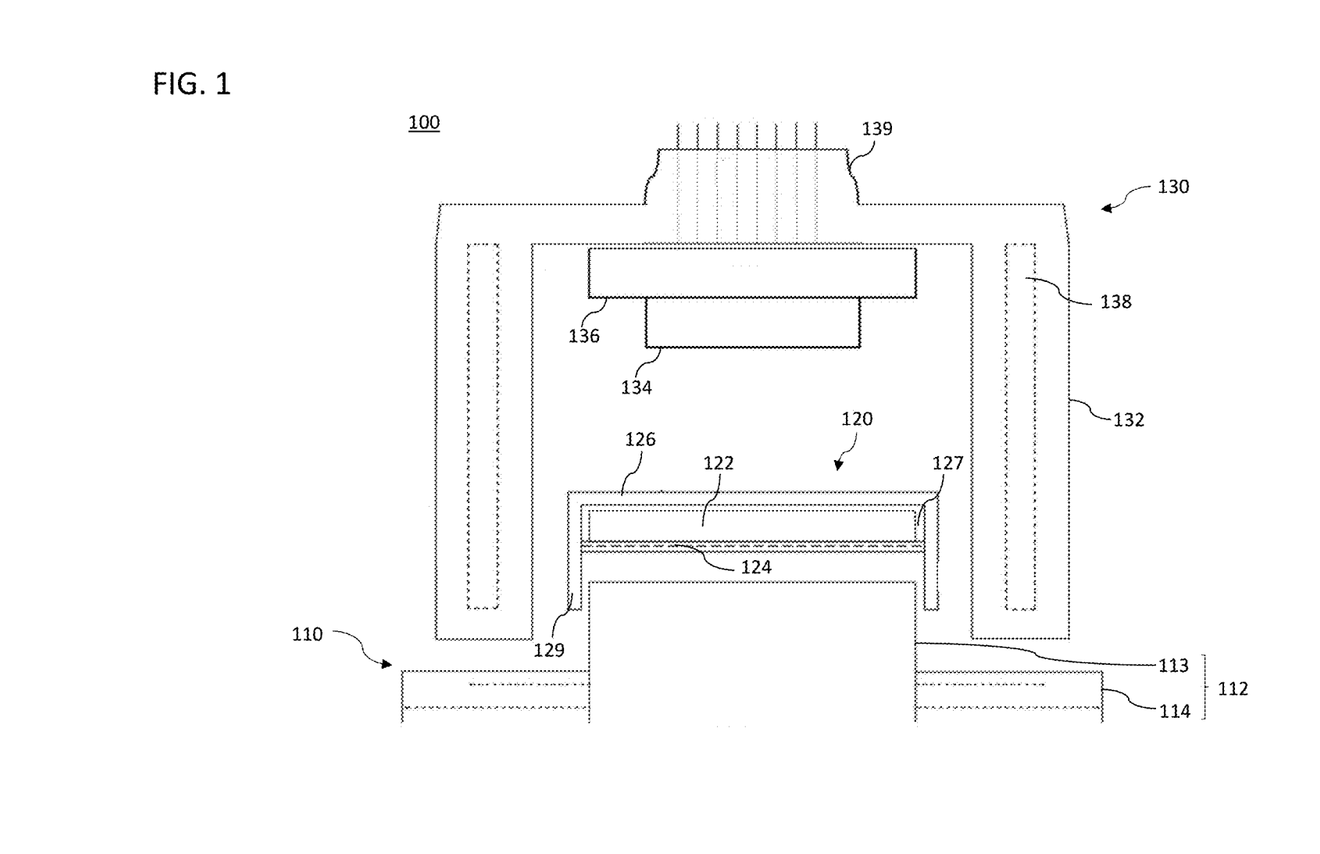
FIGS. 1 and 2 are cross-sectional views of an actuator assembly according to an exemplary embodiment of the present disclosure.
Figure 2:
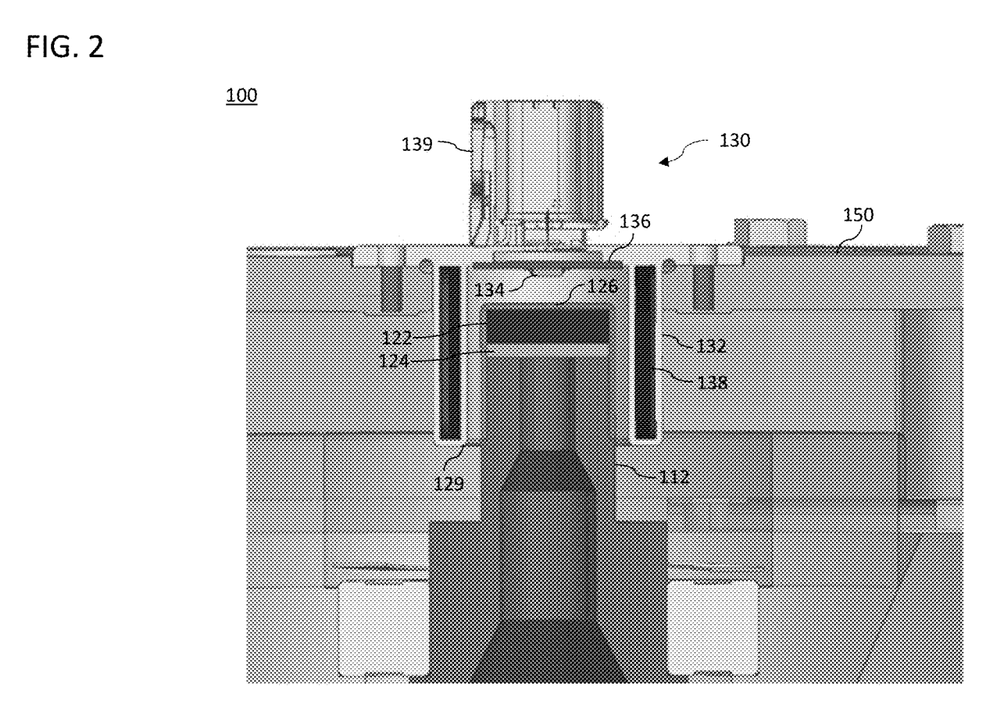
Figure 3:
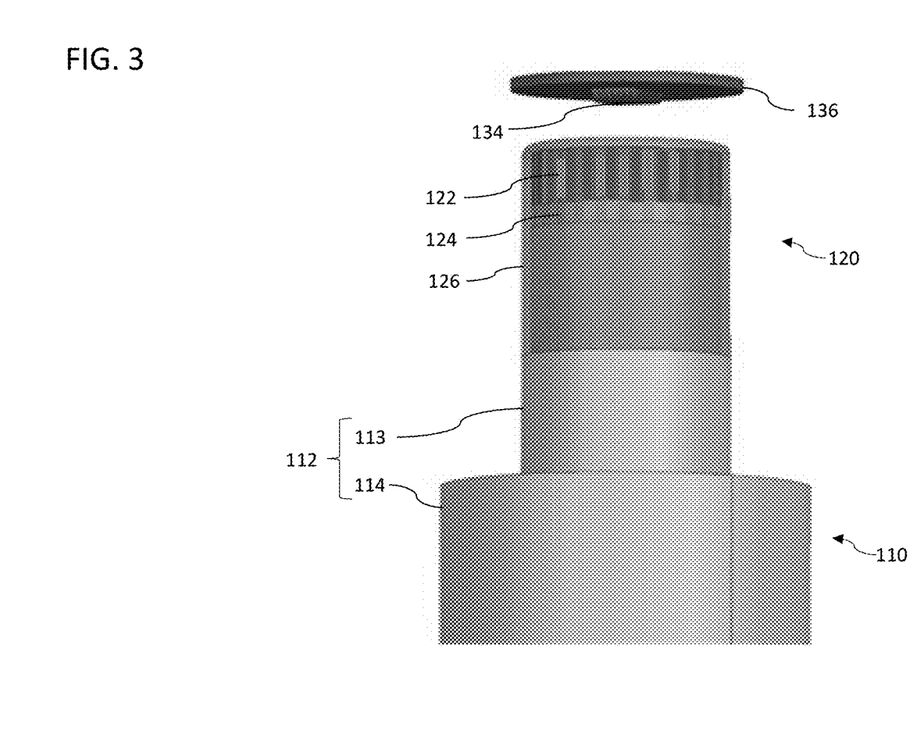
FIG. 3 shows a perspective view of a rotary sensor, a circuit board and an actuator shaft assembly according to an embodiment of the present disclosure.
Figure 4:
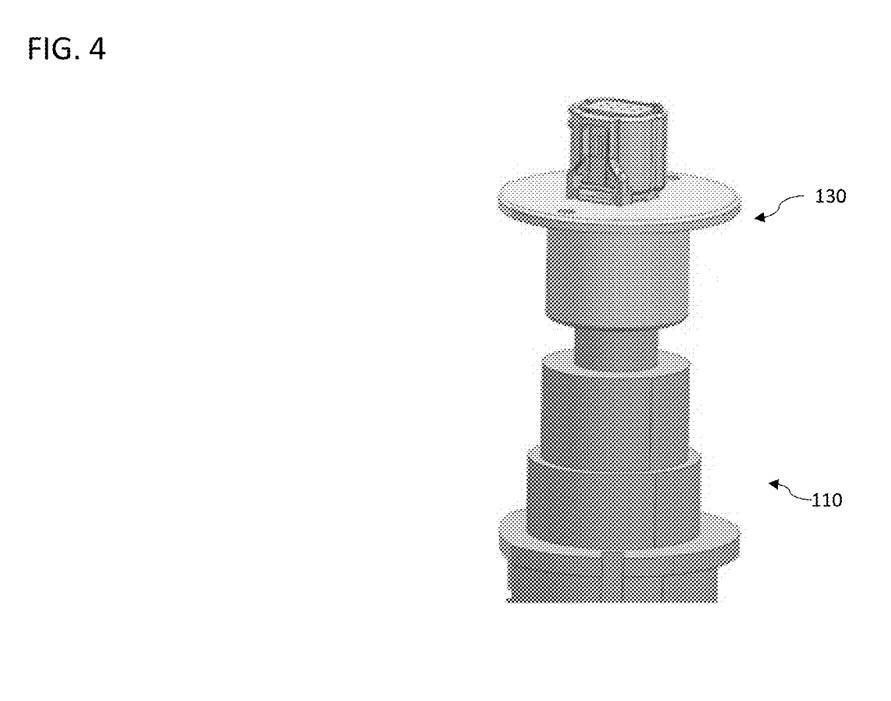
FIG. 4 illustrates a perspective view of a probe housing assembly and an actuator shaft assembly according to an embodiment of the present disclosure.

Instead of the structure of the magnet holder 126 illustrated in FIG. 1, the magnet holder can be implemented as an adhesive made of non-magnetic material. Any material that can hold the magnet 122 and the rotatable shaft 112 together and reduce leakage magnetic flux from the magnet 122 to the rotatable shaft 112 can be used for the adhesive.

The probe housing assembly 130 may include the rotary sensor 134. The rotary sensor 134 may be disposed in sensing relationship with the rotatable shaft 112 (or the magnet 122). For example, the rotary sensor 134 may be positioned adjacent to, or aligned with, the distal end of the rotatable shaft 112 (or the magnet 122). The rotary sensor 134 is responsive to the rotation of the rotatable shaft 112 (or the magnet 122). Upon the rotation of the rotatable shaft 112, the magnetic field generated by the magnet 122 mounted to the rotatable shaft 112 will appear to the rotary sensor 134 as a rotating magnetic field that may be used to monitor a rotational position, movement, or status of the rotatable shaft 112. The rotary sensor 134 measures the magnetic field generated by the magnet 122. The measurements obtained by the rotary sensor 134 are used to calculate, for example, but not limited to, one or more of radial position, rotations per minute (RPM), direction of rotation of the rotatable shaft 112 and the like. The rotary sensor 134 may generate an output signal indicative of the detected or monitored result associated with the rotatable shaft 112 (or the magnet 122) such as magnetic field/flux measurement results. A processor included in the circuit board 136, an electronic control unit (ECU) or the rotary sensor 134 can calculate the radial position, rotations per minute (RPM), direction of rotation of the rotatable shaft 112 based on the output signal of the rotary sensor 134.

The rotary sensor 134 can be any suitable device(s) for generating signal responsive to the rotation of the rotatable shaft 112 (or the magnet 122). For example, the rotary sensor 134 can be an analog or digital type sensor responsive to a magnetic field. The rotary sensor 210 may be a Hall effect sensor, a magnetoresisitve (MR) sensor, or any other sensor known in the art with similar capabilities.

The rotary sensor 134 is supported on a circuit board 136, and is electrically connected with the circuit board 136. For example, the rotary sensor 134 is directly mounted on a side of the circuit board 136, such as by soldering or by any other suitable method. Alternatively, the rotary sensor 134 can be indirectly connected to the circuit board 230, such as by wire or by any other suitable method.

A magnetic shield 138 surrounds the magnet 122 and the rotary sensor 134. For example, the magnet 122 and the rotary sensor 134 may be positioned at the center, or at least along the same longitudinal axis, of the magnetic shield 138. The magnetic shield 138 may act to encompass the magnetic flux from the magnet 122 to the rotary sensor 134 and also to shield the rotary sensor 134 from any external magnetic field such as stray field or magnetic field from the outside of the probe housing assembly 130 and magnetic field generated by the motor. The magnetic shield 138 may protect the rotary sensor 134 from influences outside the probe housing assembly 130. Further, by having the magnetic shield 138 at least substantially surround the magnet 122, the magnetic flux generated from the magnet 122 does not extend out of the probe housing assembly 130.

The magnetic shield 138 may be cylindrically-shaped, where a cross-section of a portion of the cylindrical shape of the magnetic shield 138 may be rectangular. However, a cross-section of the magnetic shield 138 can have any shape such as an oval, square, rectangle, triangle, diamond, and so forth.

The magnetic shield 138 is made of, for example, but not limited to, soft magnetic material. The soft magnetic material generally has a small remanence field. Conversely, the soft magnetic material loses most of its magnetization when an applied field is removed. The soft magnetic material may have high saturation flux density (i.e. greater than 0.5 Tesla) and high relative permeability (i.e. greater than 100). Examples of the soft magnetic material include, but are not limited to, pure or soft iron, steel alloy, low carbon steel with carbon less than 4%, Iron-Cobalt (Fe—Co) alloys, Iron-Nickel-Cobalt (Fe—Ni—Co) alloys, or Iron-Nickel (Fe—Ni) alloys such as permalloy.

For instance, the magnetic shield 138 may be a hollow steel ring.

The magnetic shield 138 may be included in the probe housing assembly 130. The housing 132 fully or partially covers the magnetic shield 138 by overmold material such as plastic. For example, the magnetic shield 138 is embedded in the housing 132. Alternatively, the magnetic shield 138 may be a separate part from the housing 132. And, the magnetic shield 138 can be included in or fixed to any stationary part of the actuator assembly 100 instead of the housing 132.

The housing 132 of the probe housing assembly 130 may have an inner space where the circuit board 136 and the rotary sensor 134 are positioned therein. Further, at least a part of the actuator shaft assembly 110, such as the magnet 122 and/or the distal end of the rotatable shaft 112, is disposed in the inner space of the housing 132.

Figure 7:
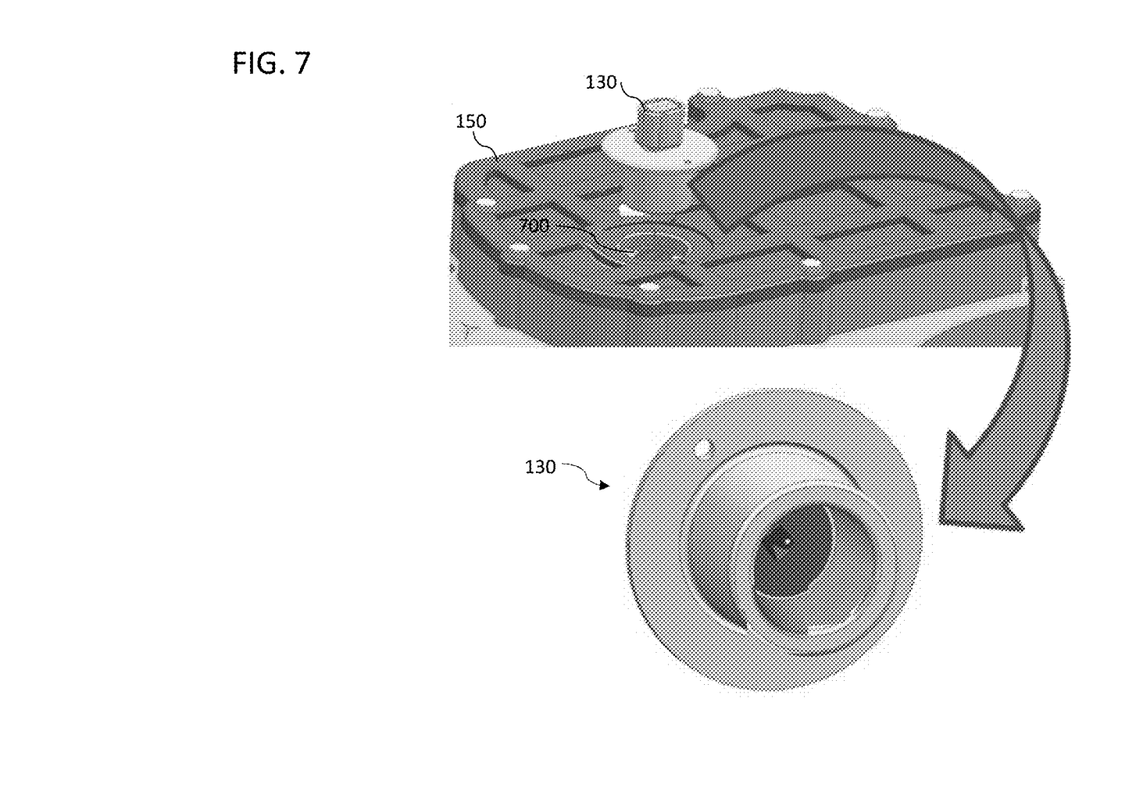
FIG. 7 illustrates a perspective view of a actuator housing assembly and a probe housing assembly according to an embodiment of the present disclosure.

As shown in FIG. 7, the probe housing assembly 130 may be a separate element from an actuator housing assembly 150 accommodating the actuator such as the motor. The probe housing assembly 130 can be inserted into a hole 700 formed on the actuator housing assembly 150 and decoupled from the actuator housing assembly 150. However, the probe housing assembly 130 can be integrated as one piece with the actuator housing assembly 150.

Optionally, the rotatable shaft 112 may include a first shaft portion 113 and a second shaft portion 114 having a larger diameter than the first shaft portion 113. The diameter of the first shaft portion 113 may be less than the diameter of the inner surface of the housing 132. However, the diameter of the second shaft portion 114 may be greater than the diameter of the inner surface (or the outer surface) of the housing 132.

The circuit board 230 may comprise any suitable circuitry and electronic components, such as a microprocessor, mounted thereon. The circuit board 136 may be mounted inside of the housing 132. The circuit board 230 can be retained in the housing 210 by any suitable manner, such as by a plurality of clips or snaps integrally formed in the housing 210 or screws. The circuit board 136 may be installed between one end of the rotatable shaft 112 and the inner surface of the housing 132. For example, the circuit board 136 may be disposed in the uppermost portion of the housing 132. The circuit board 230 may be arranged generally perpendicular to the rotation axis of the rotatable shaft 112, although it is not required. Although the circuit board 230 is fully contained within the housing 210 in FIG. 1, the circuit board 230 can be located outside of the housing 132 and be connected to the rotary sensor 134 and other electric elements included in the probe housing assembly 130 by wires.

The housing 132 may further include a connector 139. The connector 139 has one or more electrical wires. One end of the electrical wire of the connector 139 may be electrically connected to the circuit board 136, and the other end of the electrical wire of the connector 139 may be a pin which can be connected with an electrical terminal.

The shield and magnet arrangement according to some embodiments of the present disclosure may provide a safeguard against external magnetic fields, which are very difficult to control. Further, certain embodiments of the present disclosure may show robust stray field immunity even in case of high voltage and current applications such as traction drive. Additionally, some embodiments of the present disclosure may reduce errors in measurement of a rotary position. For example, the magnetic shield 138 may act to encompass the magnetic flux from the magnet 122 to the rotary sensor 134 and also to shield the rotary sensor 134 from any external magnetic field such as stray field or magnetic field from the outside of the probe housing assembly 130 and magnetic field generated by the motor. The magnetic shield 138 may protect the rotary sensor 134 from influences outside the probe housing assembly 130. Further, by having the magnetic shield 138 at least substantially surround the magnet 122, the magnetic flux generated from the magnet 122 does not extend out of the probe housing assembly 130. The non-magnetic material 124 may reduce leakage magnetic flux from the magnet 122 to the rotatable shaft 112. The depression 123 of the magnet 122 may reduce the error in the sensing operation or measurement from the rotary sensor 134 by generating the U-shaped magnetization to provide uniform magnetic field to the rotary sensor 134.

Although the example embodiments have been described in detail, it should be understood that various changes, substitutions and alterations can be made herein without departing from the spirit and scope of the application as defined by the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. An actuator assembly, comprising:
   a rotatable shaft;
   a magnet mounted to the rotatable shaft;
   non-magnetic material positioned between the magnet and the shaft;
   a rotary sensor configured to be responsive to rotation of the magnet for generating a signal;

a housing comprising a magnetic shield surrounding at least a part of the rotary sensor and at least a part of the magnet mounted to the shaft to shield the sensor and the magnet from an external magnetic field; and a magnet holder fixing the magnet to the rotatable shaft, wherein the magnet is positioned inside the magnet holder made of non-magnetic material and a part of the magnet holder is disposed between the rotary sensor and the magnet to cover the magnet.

2. The actuator assembly of claim 1, wherein the magnetic shield is made of soft magnetic material.

3. The actuator assembly of claim 1, wherein the magnetic shield is embedded in the housing.

4. The actuator assembly of claim 1, wherein the magnetic shield surrounds lateral sides of the sensor and the magnet.

5. The actuator assembly of claim 1, wherein the magnetic shield has a cylindrical shape in which the sensor and the magnet are disposed.

6. The actuator assembly of claim 1, wherein the magnetic shield comprises steel having a hollow cylinder shape.

7. The actuator assembly of claim 1, wherein the magnet holder comprises:

a space in which the magnet is disposed; and an opening into which the shaft is inserted.

8. The actuator assembly of claim 1, wherein the magnet has a depression formed on a surface of the magnet facing the sensor.

9. The actuator assembly of claim 1, wherein the non-magnetic material positioned between the magnet and the shaft is potting material or plastic.

10. The actuator assembly of claim 1, wherein the non-magnetic material of the magnet holder is brass or aluminum.

11. The actuator assembly of claim 1, wherein the magnet has a shape so that magnetization of the magnet is u-shaped.

12. The actuator assembly of claim 1, further comprising a circuit board positioned between the sensor and an inner surface of the housing.

13. The actuator assembly of claim 1, wherein the shaft comprises a first shaft portion which having a diameter less than a diameter of an inner surface of the housing and a second shaft portion which has a diameter greater than the diameter of the inner surface of the housing.

14. The actuator assembly of claim 1, wherein the magnet holder has an opening arranged opposite to the part of the magnet holder disposed between the rotary sensor and the magnet, and a part of the shaft is inserted in an inner cavity of the magnet holder through the opening of the magnet holder.

* * * * *